(12) United States Patent
Gläsel et al.

(10) Patent No.: US 7,557,577 B2
(45) Date of Patent: Jul. 7, 2009

(54) WATER-SOLUBLE PARAMAGNETIC SUBSTANCE REDUCING THE RELAXATION TIME OF THE COOLANT IN AN MRI SYSTEM

(75) Inventors: Norbert Gläsel, Schnaittach (DE); Ulrich Nerreter, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 799 days.

(21) Appl. No.: 11/007,507

(22) Filed: Dec. 8, 2004

(65) Prior Publication Data
US 2005/0123480 A1 Jun. 9, 2005

(30) Foreign Application Priority Data
Dec. 8, 2003 (DE) .............................. 103 57 186
Feb. 26, 2004 (DE) .................... 10 2004 009 286

(51) Int. Cl.
*G01V 3/00* (2006.01)
*A61K 49/00* (2006.01)
*A61K 49/18* (2006.01)
*A61K 49/06* (2006.01)
*H01F 5/00* (2006.01)
*A61B 5/055* (2006.01)
*F25D 17/02* (2006.01)
*C07F 5/00* (2006.01)
*C07F 19/00* (2006.01)
*G01N 24/08* (2006.01)

(52) U.S. Cl. .................. 324/315; 324/309; 324/318; 324/307; 424/9.364; 424/9.365; 424/9.351; 424/9.323; 335/299; 335/300; 335/301; 600/410; 600/411; 600/419; 62/436; 62/440; 436/173; 436/174

(58) Field of Classification Search ......... 600/407–435; 436/173, 174; 424/9.36, 9.351, 9.364, 9.323; 324/300–322; 427/2.24; 534/16; 62/436, 62/440; 335/299–301; 165/206, 80.2
See application file for complete search history.

(56) References Cited

U.S. PATENT DOCUMENTS

| | | | | |
|---|---|---|---|---|
| 3,456,183 A | * | 7/1969 | Codrington et al. | ......... 324/303 |
| 5,155,215 A | * | 10/1992 | Ranney | ........................ 534/16 |
| 5,260,050 A | * | 11/1993 | Ranney | ................... 424/9.351 |
| 5,284,144 A | | 2/1994 | Delannoy et al. | |
| 5,512,268 A | * | 4/1996 | Grinstaff et al. | ......... 424/9.322 |
| 5,570,021 A | * | 10/1996 | Dachniwskyj et al. | ...... 324/318 |
| 5,804,164 A | * | 9/1998 | Elgavish | ................... 424/9.364 |
| 5,936,502 A | * | 8/1999 | Englund et al. | ............. 335/299 |
| 6,011,394 A | * | 1/2000 | Petropoulos et al. | ........ 324/318 |
| 6,111,412 A | * | 8/2000 | Boemmel et al. | ............ 324/318 |

(Continued)

FOREIGN PATENT DOCUMENTS

EP 1 219 971 A2 7/2002

OTHER PUBLICATIONS

Josef Lissner and Manfred Seiderer, "Klinische Kernspintomographie", Ferdinand Enke Verlag Stuttgart 1990, 2nd Edition, pp. 149-156.

*Primary Examiner*—Brij. B. Shrivastav
*Assistant Examiner*—Tiffany A Fetzner

(57) ABSTRACT

The invention relates to the use of a water-soluble paramagnetic substance, in particular a magnetic resonance contrast medium, to reduce the magnetic resonance relaxation time of a coolant for magnetic resonance systems. Furthermore the invention relates to a corresponding method for reducing the magnetic resonance relaxation time of a coolant.

20 Claims, 2 Drawing Sheets

U.S. PATENT DOCUMENTS

| | | | |
|---|---|---|---|
| 6,236,207 B1 * | 5/2001 | Arz et al. | 324/318 |
| 6,441,614 B1 * | 8/2002 | Edelstein et al. | 324/318 |
| 6,552,545 B2 * | 4/2003 | Kaindl et al. | 324/318 |
| 6,652,835 B1 * | 11/2003 | Lauffer et al. | 424/9.36 |
| 6,741,152 B1 * | 5/2004 | Arz et al. | 335/300 |
| 6,774,631 B2 * | 8/2004 | Heid | 324/318 |
| 6,867,592 B2 * | 3/2005 | Gebhardt et al. | 324/318 |
| 6,896,874 B2 * | 5/2005 | Li et al. | 424/9.323 |
| 6,909,283 B2 * | 6/2005 | Emeric et al. | 324/300 |
| 6,992,483 B1 * | 1/2006 | Emeric et al. | 324/300 |
| 7,015,692 B2 * | 3/2006 | Clarke et al. | 324/300 |
| 7,140,420 B2 * | 11/2006 | Arik et al. | 165/80.2 |
| 7,154,270 B2 * | 12/2006 | Arz et al. | 324/318 |
| 7,397,244 B2 * | 7/2008 | Cirel | 324/318 |
| 2001/0042385 A1 * | 11/2001 | Kaindl et al. | 62/436 |
| 2002/0001627 A1 | 1/2002 | Nerreter et al. | |
| 2002/0148604 A1 * | 10/2002 | Emeric et al. | 165/206 |
| 2003/0099764 A1 * | 5/2003 | Li et al. | 427/2.24 |
| 2003/0206018 A1 * | 11/2003 | Gebhardt et al. | 324/318 |
| 2004/0119474 A1 | 6/2004 | Skloss | |
| 2005/0030028 A1 * | 2/2005 | Clarke et al. | 324/318 |
| 2005/0035764 A1 * | 2/2005 | Mantone et al. | 324/318 |
| 2005/0123480 A1 * | 6/2005 | Glasel et al. | 424/9.36 |
| 2005/0168222 A1 * | 8/2005 | Arz et al. | 324/318 |
| 2006/0082370 A1 * | 4/2006 | Cirel | 324/318 |

\* cited by examiner

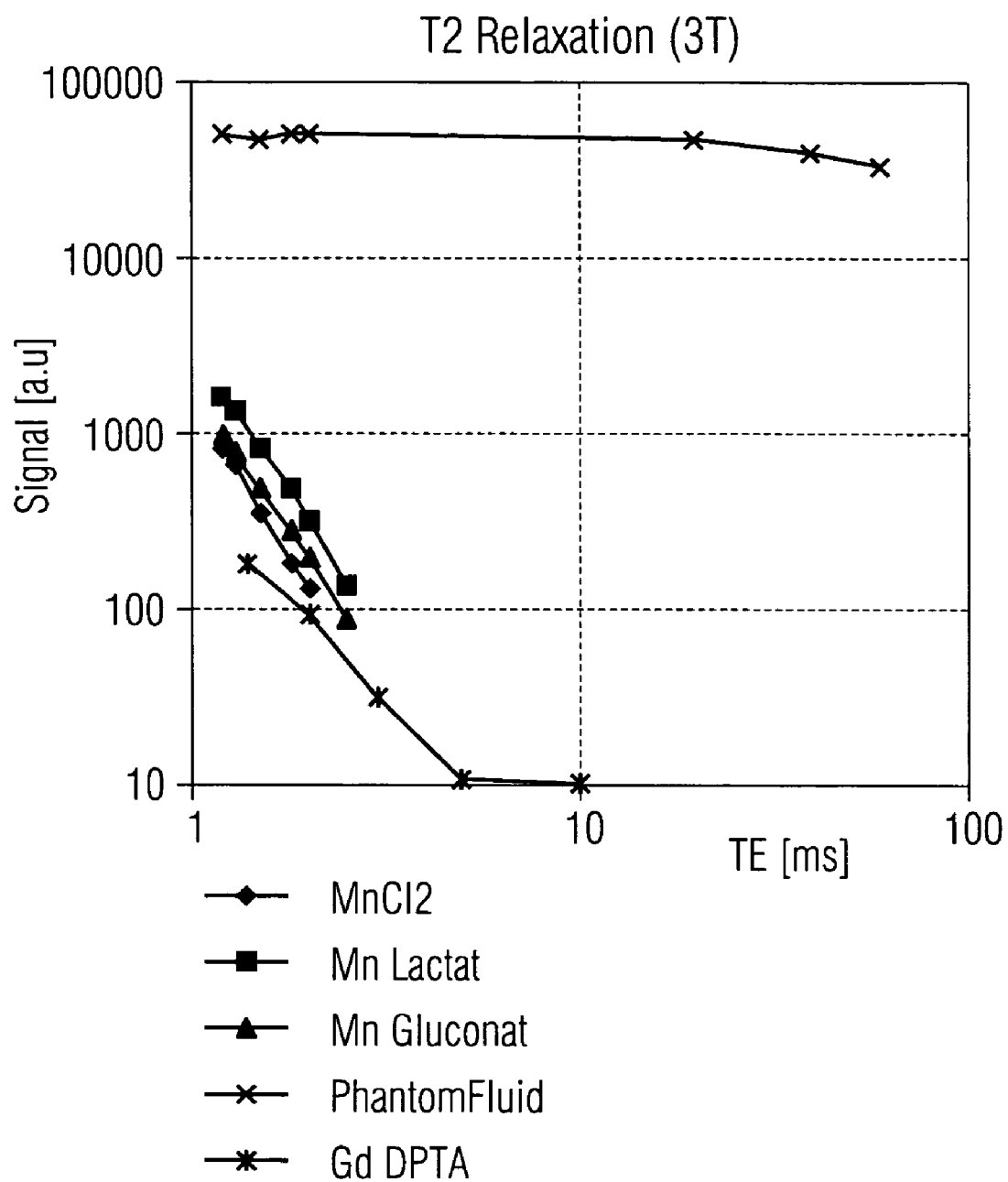

WATER-SOLUBLE PARAMAGNETIC SUBSTANCE REDUCING THE RELAXATION TIME OF THE COOLANT IN AN MRI SYSTEM

CROSS REFERENCE TO RELATED APPLICATIONS

This application claims priority to the German application No. 10357186.8 DE, filed Dec. 8, 2003, and German application No. 10 2004 009 286.9 DE, filed Feb. 26, 2004, and which are both incorporated by reference herein in their entirety.

FIELD OF INVENTION

The invention relates a water-soluble paramagnetic substance, in particular a magnetic resonance contrast medium, in order to reduce a magnetic resonance relaxation time of a coolant for magnetic resonance measuring devices and a corresponding method to reduce the relaxation time of a coolant, in order to lessen interference in the case of a measurement based on magnetic characteristics.

BACKGROUND OF INVENTION

In medical diagnostics, increasing use is made of imaging methods based on an interaction between an external energy field and the human body. Such a method is magnetic resonance tomography (MRT), also known as nuclear spin tomography. This method uses different examination methods to produce a more precise image of the individual anatomy of the patent and possible anomalies. Such visualizations can be used not only to produce an exact diagnosis, but because of their precision also to simulate and plan operations.

In MRT raw image data capture is carried out by means of high-frequency excitation of nuclear spin of the tissue to be examined in a high basic magnetic field. The high-frequency pulses cause the nuclear spins to be deflected from their position of equilibrium parallel to the basic magnetic field. The nuclear spins then precess around the direction of the basic magnetic field. The magnetic resonance signals thus generated are captured by high-frequency antennas. By appropriately selecting the resonance frequency, it is principally the hydrogen atom nuclei naturally present in large numbers in the human body which are excited. The nuclear spins then gradually relax to their initial position parallel to the basic magnetic field, whereby the magnetic resonance signal to be received correspondingly decreases again. The relaxation times, referred to here as magnetic resonance relaxation times, are among other things material-dependent. A distinction is made here between the $T_2$ relaxation time of the cross-magnetization (transverse to the basic magnetic field) and the $T_1$ relaxation time of the direct-axis magnetization (perpendicular to the cross-magnetization). Cross-sectional images of the section of the patient's body examined are then created from this raw image data. The various capture methods have undergone rapid technical development since their introduction. Image quality has been significantly improved and capture time has been greatly reduced. Precise diagnostic images with a very high level of detail form the basis for an examination of all types of individual organs, such as lungs, liver, stomach, etc., or regions of the body, such as the thorax, head or individual limbs. Furthermore, even catheter examinations in the region of the heart can to an extent be replaced by this technique.

In the case of magnetic resonance tomography, water-cooled components are generally used. The cooling water for instance dissipates the heat which occurs in the gradient coils and high-frequency transmission coils as a result of the high currents. Disadvantageously the high-frequency measurement pulses also mean that the water molecules of the cooling water present in the magnetic resonance measuring device are also excited. These then likewise correspondingly transmit imaging resonance signals. In this case in particular interference is caused in that the cooling water constantly continues to move during an MR measurement, i.e. even during transmission of a high-frequency sequence and up until the readout phase. This can result in significant artifacts in the images captured.

To avoid the disruptive influence of the cooling water on imaging as much as possible, high-frequency (HF) shielding devices have been used to date, with which the water-conducting components are shielded from the measuring space.

In the case of smaller mobile components which are not permanently built in to the magnetic resonance measuring device, such as body coils or head coils designed for measuring on individual parts of the body such as extremities or the head, such shielding is however difficult, in particular if the apparatus is adapted to the body parts to be measured and hence must have a certain degree of flexibility.

SUMMARY OF INVENTION

Based on this prior art, it is an object of this invention to reduce the disruptive effect of the coolant in NMR measurements in another way.

This object is achieved by the use according to Claim 1 and by a method according to Claim 9.

The invention is characterized in that a water-soluble paramagnetic substance is added to the coolant, which reduces a magnetic resonance relaxation time, i.e. the $T_2$ relaxation time and/or the $T_1$ relaxation time, of the coolant. The result of this is that the excitation of the nuclear spin of the coolant—at any rate to a large extent—decays in a period which is less than the echo time customarily set during a measurement. Echo time here refers to the distance between the center of the transmitted excitation pulse and the expected echo signal. The echo time set depends here among other things on the type of measurement, i.e. on the planned experiment. Normal echo times can be a minimum of 1 to 2 ms and a maximum of 200 ms.

If the signal intensity of the resonance signal of the coolant nuclear spin decays before the echo time, this means that the resonance signals transmitted by the coolant can no longer contribute to the imaging. Thus the interference of the coolant contained in the various components of the magnetic resonance measuring device can be suppressed and if appropriate high-frequency shielding of the cooling circuit of the actual measuring space can even be made completely superfluous. Unlike the normal way, this invention thus does not prevent the nuclear spin of the coolant from being excited at all, but instead ensures that the signal induced by the excitation is no longer recorded by the measuring equipment.

The dependent claims each contain particularly advantageous embodiments and developments of the invention.

A magnetic resonance contrast medium can preferably be used as a water-soluble paramagnetic substance, and is normally administered to a patient before a magnetic resonance examination, in order for example to shorten the $T_1$ and/or $T_2$ relaxation time of the blood. Surprisingly it was found that in the case of a magnetic resonance measurement, adding such a medium to the coolant significantly reduces the disruptive effects of the coolant on the imaging.

As customary in the past, water is preferably used as the coolant. Water has the advantage that it has a high thermal capacity and moreover is cheap.

The invention is preferably used for coolants to cool gradient coils and high-frequency coils of the magnetic resonance measuring device, since the cooling lines of these components are particularly close to the measuring space. However, in principle the invention can also be used for coolants in all other components of a magnetic resonance measuring device, e.g. in cooled gradient amplifiers, high-frequency amplifiers, cabinet air-conditioning systems, helium compressors to cool the supraconducting magnet, high-frequency reactive loads, e.g. in the form of TAS-C (Transmitter Antenna Selector—Controller), high-frequency power packs or high-frequency transmission antennas.

Advantageously the paramagnetic substance is selected from gadolinium compounds and manganese compounds, which have already proved themselves as MR contrast media administered to a patient. Particularly preferred here are gadolinium complexes, especially a gadolinium DTPA complex (DTPA=diethylenetriaminepentaacetate). The gadolinium DTPA complex is most preferred here, because it is very effective and in addition is cheap to synthesize. This complex can in turn be complexed with N-methylglucamine.

The water-soluble paramagnetic substance is preferably added in a concentration of approx. 0.1 mol/l to 0.25 mol/l (e.g. in relation to gadolinium).

When reducing the relaxation time of the coolant it is preferable for the $T_2$ relaxation time in particular to be reduced, since this has a considerably greater effect on the strength of the resonance signal to be measured than the $T_1$ relaxation time. In addition it is also however desirable if the $T_1$ relaxation time is reduced as well.

The $T_2$ relaxation time should by preference be reduced to below approx. 5 ms, preferably to below approx. 1 ms. In this case the $T_2$ relaxation time is below the echo times customarily set in MR measurements.

BRIEF DESCRIPTION OF THE DRAWINGS

The invention is described below in greater detail with reference to the enclosed figures on the basis of exemplary embodiments. The drawings show.

DETAILED DESCRIPTION OF INVENTION

A conventional head coil 1, as is generally used nowadays for magnetic resonance tomography measurements of the head, has a cylindrical annular element surrounding a measuring space 3, in which the head of a patient is located during the examination. Various gradient coils 6 are arranged in the annular element and serve to generate a magnetic field gradient. On the inside of the annular element during the measurement is a high-frequency coil 7, which acts as an antenna to transmit the excitation pulses and/or to receive the resonance signals.

Figure 1:
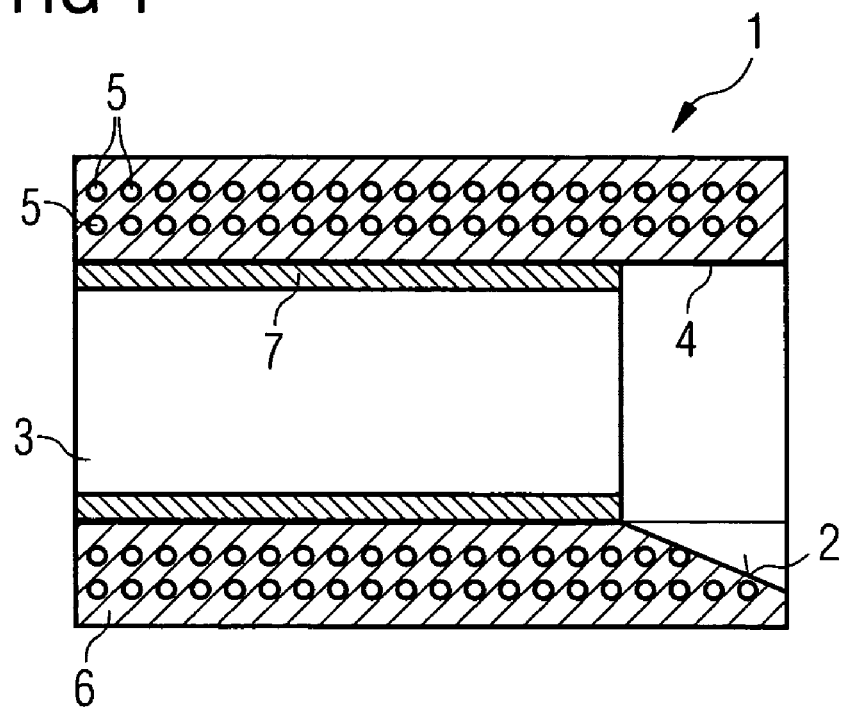
FIG. 1 a longitudinal section through a magnetic resonance tomography head coil, FIG. 2 a cross-section through the head coil from FIG. 1, FIG. 3 a diagram in which the $T_2$ relaxation of different coolants is illustrated.
Figure 2:
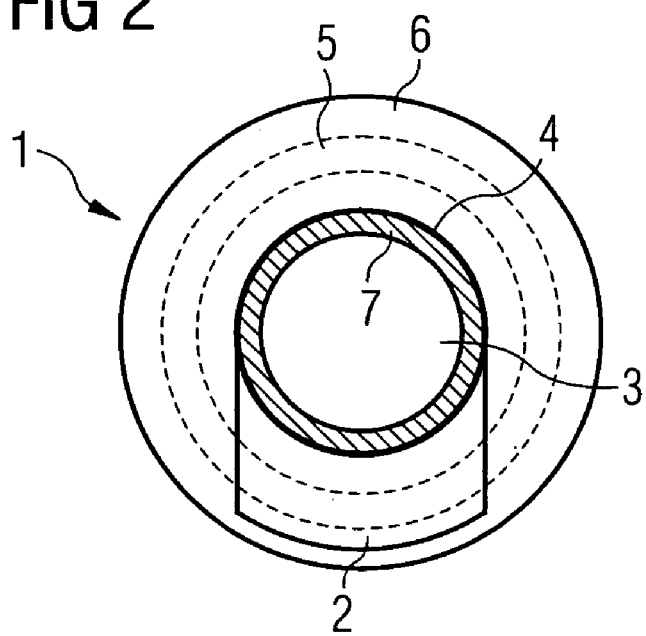

Circumferential cooling water lines 5 are arranged within the gradient coils 6, with cooling water flowing continuously through said lines during operation of the coil 1. By means of this cooling water the heat occurring as a result of the high currents in the gradient coils 6 is dissipated, in order to prevent overheating of the coil 1. As FIGS. 1 and 2 show, the cooling water lines 5 are located directly next to the measuring space 3 or the high-frequency coil 7.

To reduce the effect of the cooling water on the measurement, or if possible to avoid it completely, the annular element is clad on the inside with a conductive, preferably metallic, shielding, which separates the measuring space 3 and thus also the high-frequency coil 7 from the cooling lines 5. However, the shield causes a problem in an area 2 formed as an oblique recess within the coil 1 located on one face of the head coil 1, the neck of the patient being in this area during measurement. In this area the inclination means the cooling water circuit cannot be shielded from the measuring space 3, or only with great effort using the conventional HF shields.

Hence according to the present invention a water-soluble paramagnetic substance, for example a magnetic resonance contrast medium, is added to the cooling water, in order in particular to reduce the $T_2$ relaxation time of the cooling water.

A particularly preferred substance for use in the present invention was produced as described below. This substance is also used in a similar form as a contrast medium.

Gadolinium oxide ($Gd_2O_3$), diethylentriaminepentaacetate (DTPA, structure formula: $HOOC—CH_2—N[C_2H_4—N(CH_2—COOH)_2]_2$) and D(-)-N-methylglucamine react under simple conditions to form a gadolinium oxide diethylentriaminepentaacetate-D(-)-N-methylglucamine complex. This substance is easily water-soluble and magnetically active and is thus interesting for NMR applications.

For synthesis, stoichiometric quantities of gadolinium oxide, diethylentriaminepentaacetate and D(-)-N-methylglucamine were made to react by agitating them in an aqueous suspension and by increasing the temperature. The reaction was completed when the reaction solution appeared clear to slightly cloudy (after approx. 24 hours). Filtration produces a clear stable solution of the gadolinium complex.

The reaction is shown in the following reaction equations:

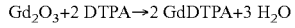

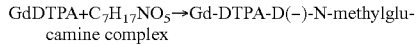

where:

M[$Gd_2O_3$]=363 g/mol

M[DTPA]=393 g/mol

M[D(-)-N-methylglucamine]=195.22 g/mol and

M[GdDTPA]=547 g/mol

The Gd complex produced in this way was used to measure the effectiveness of relaxation. The concentration here was approx. 0.22 mol/l in relation to Gd.

The relaxation effectiveness of the various agents was examined on a Trio Magnetom 3T whole body apparatus with a magnetic field of 3 teslas. To do this, the $T_2$ relaxation of water at a concentration of 17.4 g/l (equivalent to 0.22 mol/l) of the GD complex solution produced above was measured. Alternatively, cooling water mixtures with 4 g/l manganese chloride, 11 g/l Mn-gluconate and 8 g/l Mn-lactate were measured.

The results of the measurements are shown in FIG. 3. Illustrated here is the measured signal over the set echo time TE (in ms). FIG. 3 clearly shows that for all media the $T_2$ relaxation time is considerably reduced compared to normal cooling water (measurement: PhantomFluid) in which no inventive substances are added. Whereas normal cooling water has a $T_2$ relaxation time of approx. 300 ms or more, the $T_2$ relaxation times are in the order of a few ms when the various substances are admixed. At 35 g/l Gd, as a complex dissolved in water, the $T_2$ and the $T_1$ relaxation times are no longer even discernable by the measuring equipment.

It should be borne in mind here that in the case of the comparative measurements the water was directly positioned in the measuring space (in phantoms). However, the actual cooling water is situated outside the actual measuring space, i.e. in an area in which the high-frequency excitation pulses are considerably reduced and the basic magnetic field no longer has the required homogeneity. Both ensure that the $T_2$ relaxation time is reduced once again. Overall it must hence be assumed from this that because of the reduction in the $T_2$ relaxation time the inventive coolant mixture can no longer have any disruptive effect on the capture of the imaging data.

Long-term tests have also shown that a cooling water mixture with the aforementioned Gd complex solution advantageously has no effect on the cooling water lines, i.e. the Gd complex solution has no corrosive effect, nor does it result for example in bacterial contamination of the cooling water.

The invention claimed is:

1. A water-soluble paramagnetic substance that reduces a magnetic resonance relaxation time of a coolant used in a magnetic resonance imaging system, wherein the coolant is arranged to flow along a circumferentially extending coolant line arranged to dissipate a thermal load produced by one or more components of the magnetic imaging system, the one or more components including:
   at least a radio frequency coil and/or one or more gradient coils which are arranged to be electromagnetically shielded from the coolant line by a metallic shield except at an unshielded region defined by an oblique recess in an annular structure configured for receiving a patient,
   wherein the magnetic resonance imaging system is configured to generate an image of an organ or a region of the body of the patient located at least in part within the unshielded region, wherein the image consists of anatomical features of the organ or region of the body of the patient,
   whereby a resulting reduction of the magnetic resonance relaxation time of the coolant reduces formation of artifacts in the image of the organ or a region of the body of the patient located at least in part within the unshielded region defined by the oblique recess in the annular structure configured for receiving the patient.

2. The substance according to claim 1, wherein the substance is a magnetic resonance contrast medium.

3. The substance according to claim 1, wherein the coolant is water.

4. The substance according to claim 1, wherein the substance is a compound selected from the group consisting of gadolinium compounds and manganese compounds.

5. The substance according to claim 4, wherein the substance is a gadolinium DTPA complex.

6. The substance according to claim 1, wherein the substance is added to the coolant to create a solution, the solution has a substance concentration in a range of 0.1 mol/l to 0.25 mol/l.

7. The substance according to claim 1, wherein adding the paramagnetic substance reduces a $T_2$ relaxation time of the coolant.

8. The substance according to claim 7, wherein the $T_2$ relaxation time of the coolant is reduced to below approx. 5 ms.

9. A method for reducing a magnetic resonance relaxation time of a coolant in a magnetic resonance imaging system, the method comprising:
   adding a water-soluble paramagnetic substance to the coolant;
   circumferentially arranging a flow of the coolant through a coolant line to dissipate a thermal load produced by one or more components of the magnetic resonance imaging system, the one or more components including at least a radio frequency coil and/or one or more gradient coils;
   arranging a metallic shield to electromagnetically shield said at least a radio frequency coil from the coolant line except at an unshielded region defined by an oblique recess in an annular structure for receiving a patient; and
   configuring the magnetic resonance imaging system to generate an image of an organ or a region of the body of the patient located at least in part within the unshielded region, wherein the image consists of anatomical features of the organ or region of the body of the patient, whereby the adding of the water-soluble paramagnetic substance to the coolant reduces formation of artifacts in the image of the organ or a region of the body of the patient located at least in part within the unshielded region defined by the oblique recess in the annular structure for receiving the patient.

10. The method according to claim 9, wherein the substance is a magnetic resonance contrast medium.

11. The method according to claim 9, wherein the coolant is water.

12. The method according to claim 9, wherein the substance is a compound selected from the group consisting of gadolinium compounds and manganese compounds.

13. The method according to claim 12, wherein the substance is a gadolinium DTPA complex.

14. The method according to one of claims 9, wherein the substance is added coolant to create a solution, the solution has a substance concentration in a range of 0.1 mol/l to 0.25 mol/l.

15. The method according to claim 9, wherein adding the paramagnetic substance reduces a $T_2$ relaxation time of the coolant.

16. The method according to claim 15, wherein the $T_2$ relaxation time of the coolant is reduced to below approx. 5 ms.

17. A coolant solution, which cools one or more components of a magnetic resonance imaging system, comprising:
   a coolant fluid disposed to circumferentially flow through a coolant line to dissipate a thermal load produced by the one or more components of the magnetic resonance imaging system, the one or more components including
   at least a radio frequency coil and/or one or more gradient coils, arranged to be electromagnetically shielded from the coolant line by a metallic shield except at an unshielded region defined by an oblique recess in an annular structure configured for receiving a patient; and
   a water-soluble paramagnetic substance added to the fluid,
   wherein the addition of the water-soluble paramagnetic substance into the coolant fluid reduces a magnetic resonance relaxation time of the fluid permits the MRI system to generate an image of an organ or a region of the body of the patient located at least in part within the unshielded region, wherein the image consists of anatomical features of the organ or region of the body of the patient located at least in part within the unshielded region, and further wherein the image of the anatomical features of the organ or region of the body of the patient located at least in part within the unshielded region is free of imaging artifacts that otherwise can arise due to the coolant fluid without the paramagnetic substance.

18. The coolant according to claim 17, wherein the substance is a magnetic resonance contrast medium and the coolant is water.

19. The coolant according to claim 17, wherein the substance is a compound selected from the group consisting of gadolinium compounds and manganese compounds.

20. The coolant according to claim 17, wherein the solution has a substance concentration in a range of 0.1 mol/l to 0.25 mol/l.

* * * * *